United States Patent
Glenn et al.

(10) Patent No.: US 6,532,157 B1
(45) Date of Patent: Mar. 11, 2003

(54) ANGULATED SEMICONDUCTOR PACKAGES

(75) Inventors: Thomas P. Glenn, Gilbert, AZ (US); Roy D. Hollaway, Chandler, AZ (US); Steven Webster, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/714,622

(22) Filed: Nov. 16, 2000

(51) Int. Cl.[7] .............................. H05K 7/00; H05K 1/00; H01L 23/495
(52) U.S. Cl. ..................... 361/767; 361/784; 361/820; 174/255; 174/260; 257/676; 257/684
(58) Field of Search .................. 361/767, 728–729, 361/735–736, 743, 746, 748–752, 760–761, 764, 784–785, 820–821; 174/250–268; 29/829–842; 257/684, 688–689, 700, 706, 707, 737–738, 742–744, 778, 673–678

(56) References Cited

U.S. PATENT DOCUMENTS 5,057,907 A * 10/1991 Ooi ............................ 257/80
5,583,377 A * 12/1996 Higgins, III ................ 257/707
5,864,132 A * 1/1999 Holcombe ............... 250/208.1

* cited by examiner

Primary Examiner—David Martin
Assistant Examiner—Michael L. Lindinger
(74) Attorney, Agent, or Firm—Skjerven Morrill LLP; James F. Parsons

(57) ABSTRACT

A novel semiconductor package comprises a rigid dielectric, e.g., ceramic, substrate having first and second portions joined to one another at respective margins thereof to form an angle, e.g., a right angle, between the portions. Each of the portions has electrically conductive paths connected to one another through the angle. A semiconductor device, e.g., a die, is mounted to the first portion and electrically connected to the conductive paths thereof. An array of electrically conductive lands, balls, or pins are mounted on the second portion for connecting the package to a printed circuit board. In a high-power embodiment, the device is mounted directly on a threaded stud projecting from the first portion to enable intimate thermal coupling of the device to a heat sink. In another embodiment, a connector projects from the first portion to optically couple an optical device directly to an end of a fiber optic cable.

23 Claims, 5 Drawing Sheets

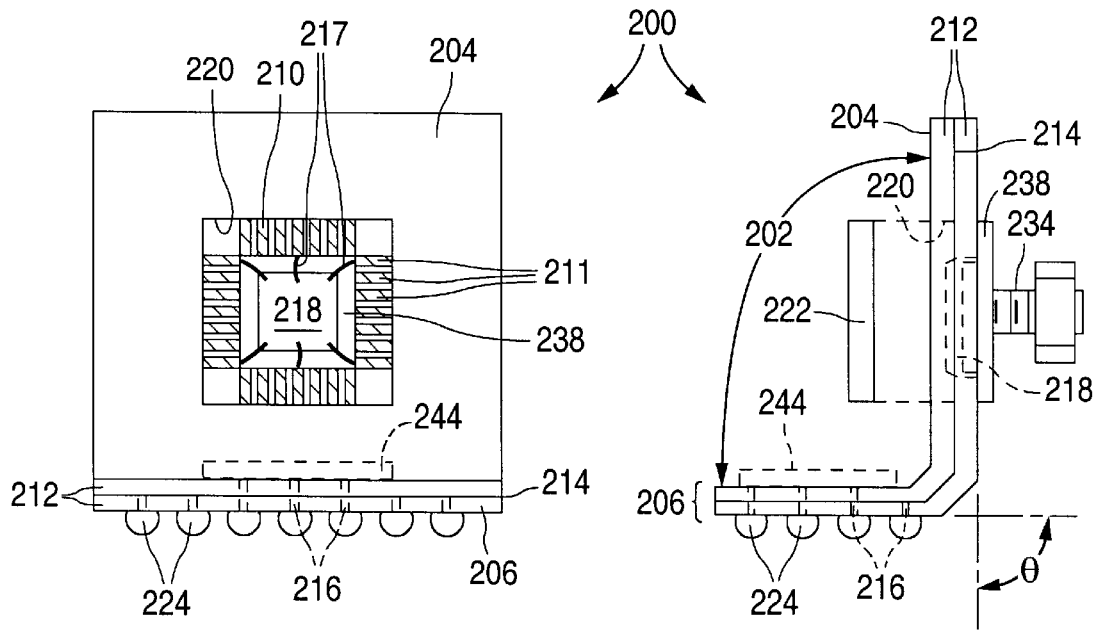
FIG. 6  FIG. 7
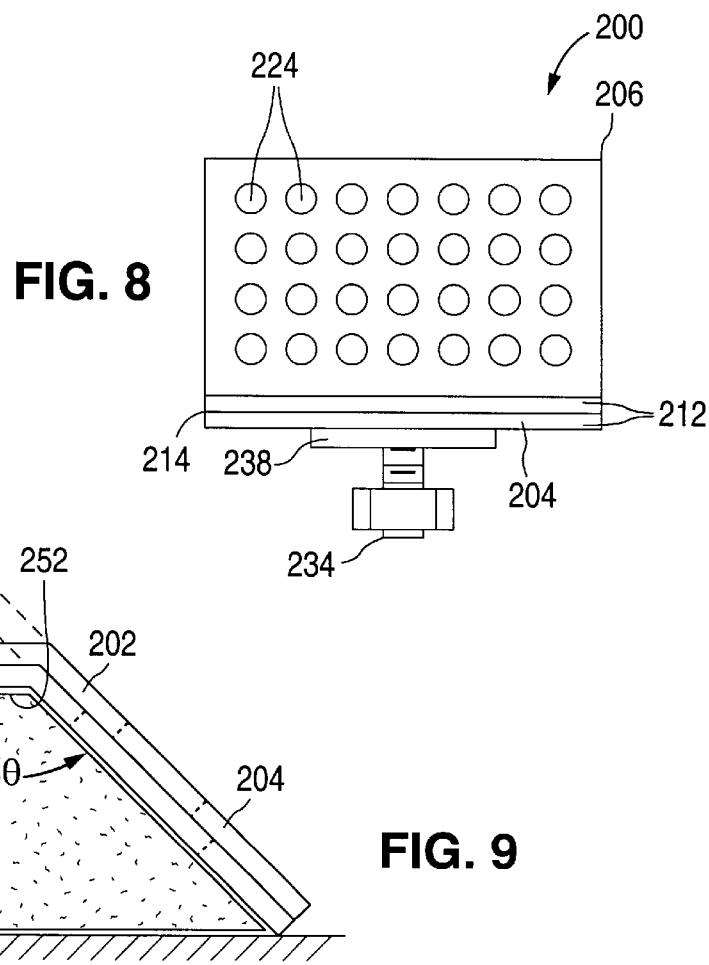
FIG. 8
FIG. 9

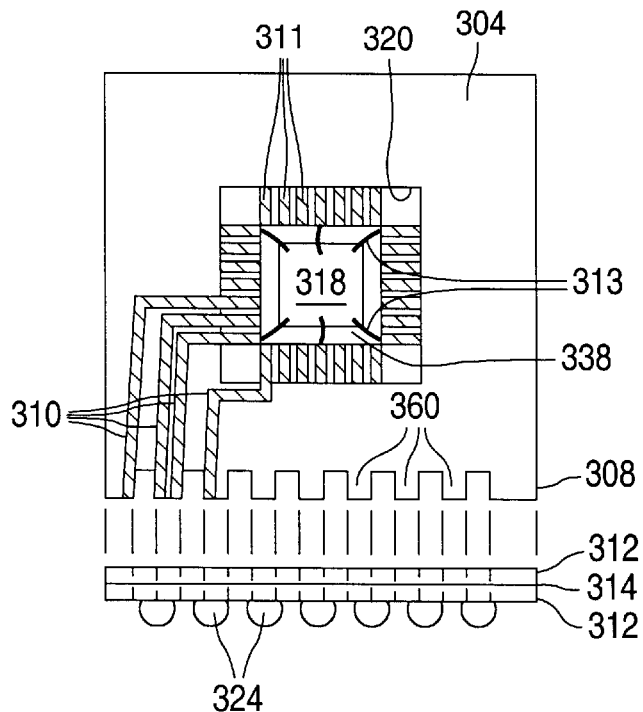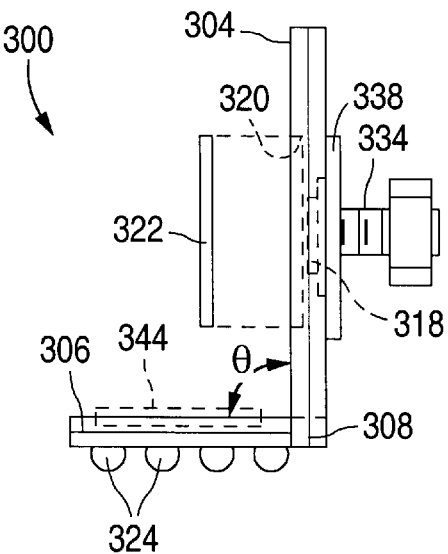
FIG. 10     FIG. 11
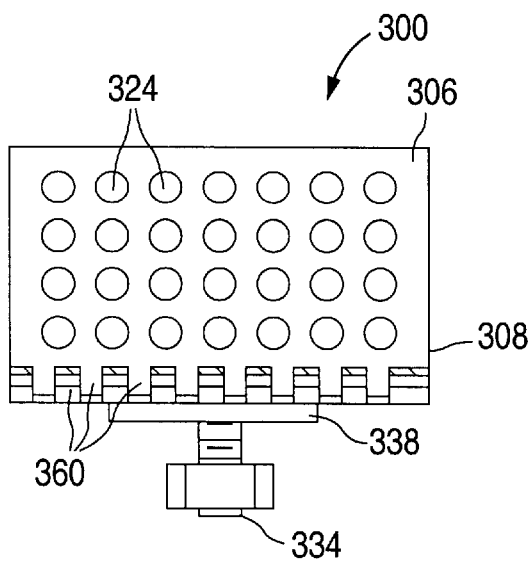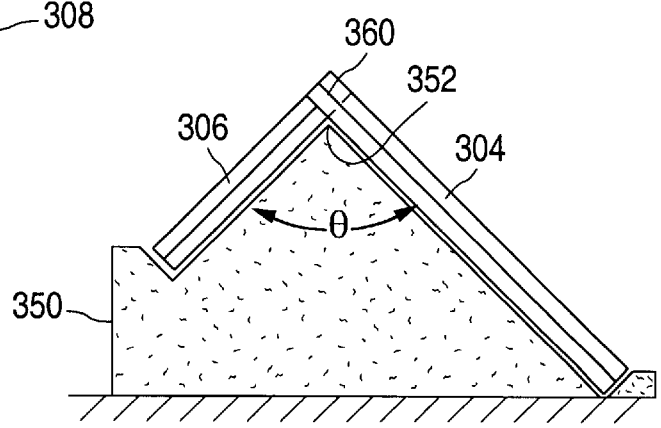
FIG. 12     FIG. 13

ANGULATED SEMICONDUCTOR PACKAGES

BACKGROUND

1. Technical Field

This invention pertains to semiconductor packaging in general, and in particular, to semiconductor packages having portions fixed at an angle relative to one another.

2. Related Art

The current trend in electronics toward devices that are more compact and yet more functional has resulted in the need to house more components in smaller volumes, and to dissipate more heat from such smaller volumes. This trend has created a concomitant demand for semiconductor packages capable of meeting these same objectives.

To achieve a greater power dissipation from a semiconductor package of a given size, it is known to mount the bottom surface of a high-power semiconductor device, e.g., a die, or "microchip," directly on a thermally conductive "heat slug" in the package, and to couple the heat slug through the bottom of the package to a heat sink disposed above, below, or within a printed circuit board ("PCB") to which the package is mounted and electrically connected. However, since the thermal coupling of the die to the heat sink and the electrical connection of the die to the PCB are located in the same or parallel planes, this arrangement prevents one or both of the thermal coupling and the electrical connection to the die from being as short and direct as possible.

Another known approach is to reverse the foregoing orientation of the die and heat slug such that the die is thermally coupled through the top of the package to a heat sink disposed above the package. However, this arrangement is inconsistent with a requirement for a low-profile package.

It is also known to connect a fiber optic cable to the top surface of a semiconductor package such that the end of the cable is optically coupled directly to the active surface of an optical chip contained therein. However, since the fiber bundle extends upright from the package, it also extends upright relative to a PCB to which the package is mounted, and hence, this optical coupling arrangement is also inconsistent with a low-profile package.

A need therefore exists for a semiconductor package in which a semiconductor die can be thermally and/or optically coupled directly to a heat sink and/or an optical cable in a first plane, and electrically connected to an associated PCB in a distinct, divergent second plane, without interference between the thermo-optical couplings and the electrical connections to the die, and which also satisfies the requirement of a low profile package.

SUMMARY

This invention provides several embodiments of a low-profile semiconductor package in which a semiconductor device can be thermally and/or optically coupled directly to a heat sink and/or an optical cable in a first plane, and electrically connected to an associated PCB located in a second plane that is distinct and divergent from the first plane, without interference between the respective couplings and the connections to the device.

One embodiment of the novel package comprises a rigid dielectric, e.g., a ceramic, substrate having two portions that are joined to one another at respective adjacent margins thereof to form an angle, e.g., a right angle, between the two portions. Each portion has electrically conductive paths connected through the angle to the electrically conductive paths in the other portion. In one advantageous embodiment, this connection is effected by resilient, arcuate metal leads extending between the respective adjacent margins of the two substrate portions to accommodate angular tolerances between surfaces to which the two portions are respectively mounted.

A semiconductor device, such as a die or a "micromachine," is mounted to a first one of the portions in electrical connection with the electrically conductive paths thereof. An array of electrically conductive balls, lands, or pins is mounted on the second one of the portions and in electrical connection with the conductive paths thereof for connecting electrical signals between the package and, e.g., a PCB to which the package is mounted.

In a high-power embodiment, the device can be mounted on a threaded stud projecting from the first portion of the substrate to enable intimate thermal coupling of the device to a heat sink, such as a cold wall. Optionally, associated low-power active or passive components can also be mounted on the second portion to achieve an enhanced component packaging density. In another embodiment, an optical connector can project from the first portion of the substrate to enable direct optical coupling of the device to the end of a fiber optic cable.

By locating thermo-optical couplings and electrical connections to the device in two different, non-parallel planes, both can be effected directly and efficiently without interfering with the other in a package having a relatively low profile.

A better understanding of the above and other features and advantages of the invention may be had from a consideration of the detailed description below of some exemplary embodiments thereof, particularly if such consideration is made in conjunction with the appended drawings.

BRIEF DESCRIPTION OF THE DRAWINGS

FIG. 6 is a side elevation view of a second exemplary embodiment of an angulated semiconductor package in accordance with the present invention;

FIG. 7 is another side elevation view of the second package embodiment illustrated in FIG. 6;

FIG. 8 is a bottom plan view of the second package embodiment illustrated in FIGS. 6 and 7;

FIG. 9 is a side elevation view of the thermoforming of the substrate of the second package embodiment;

FIG. 10 is a side elevation view of a third exemplary embodiment of an angulated semiconductor package in accordance with the present invention;

FIG. 11 is another side elevation view of the third package embodiment illustrated in FIG. 10;

FIG. 12 is a bottom plan view of the third package embodiment illustrated in FIGS. 10 and 11; and, FIG. 13 is an elevation view of the welding or brazing together of two portions of the substrate of the third package embodiment.

DETAILED DESCRIPTION

Figure 1:
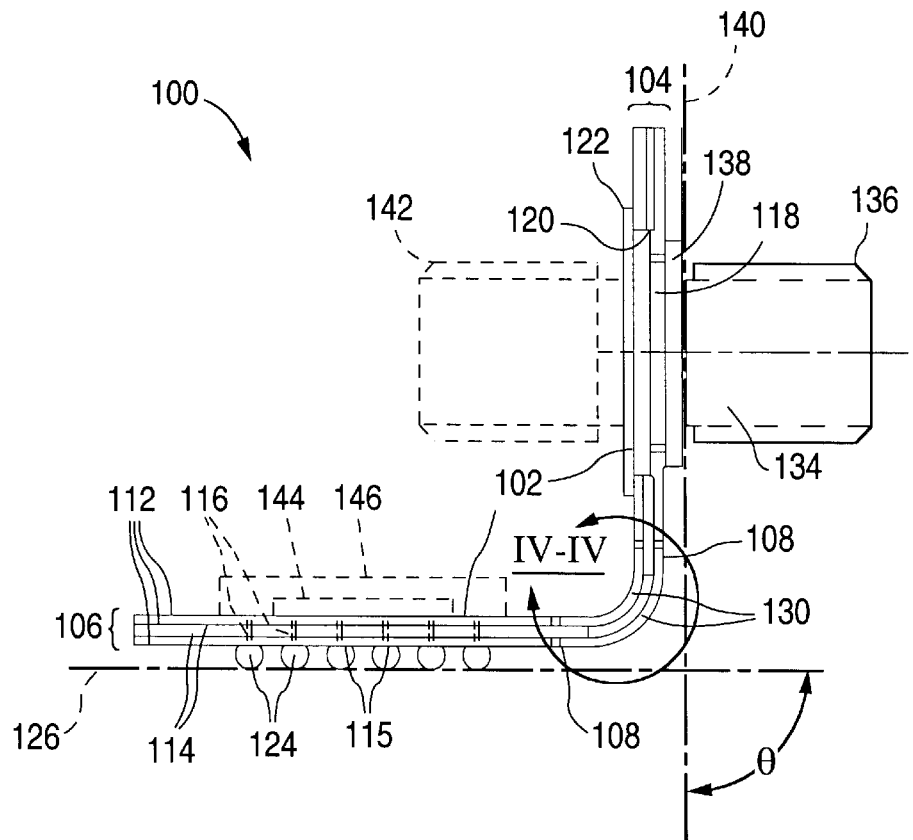
FIG. 1 is a side elevation view of a first exemplary embodiment of an angulated semiconductor package in accordance with the present invention.
Figure 2:
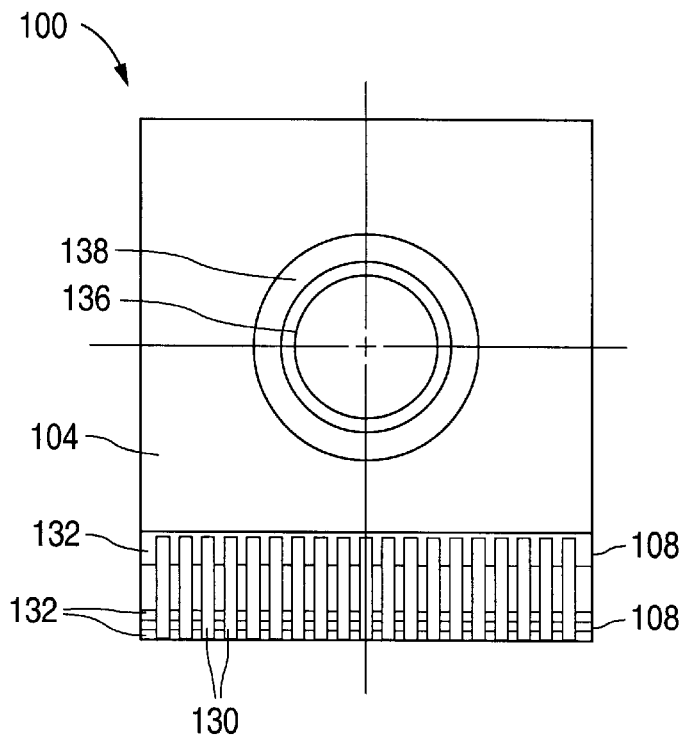
FIG. 2 is another side elevation view of the first package embodiment illustrated in FIG. 1.
Figure 3:
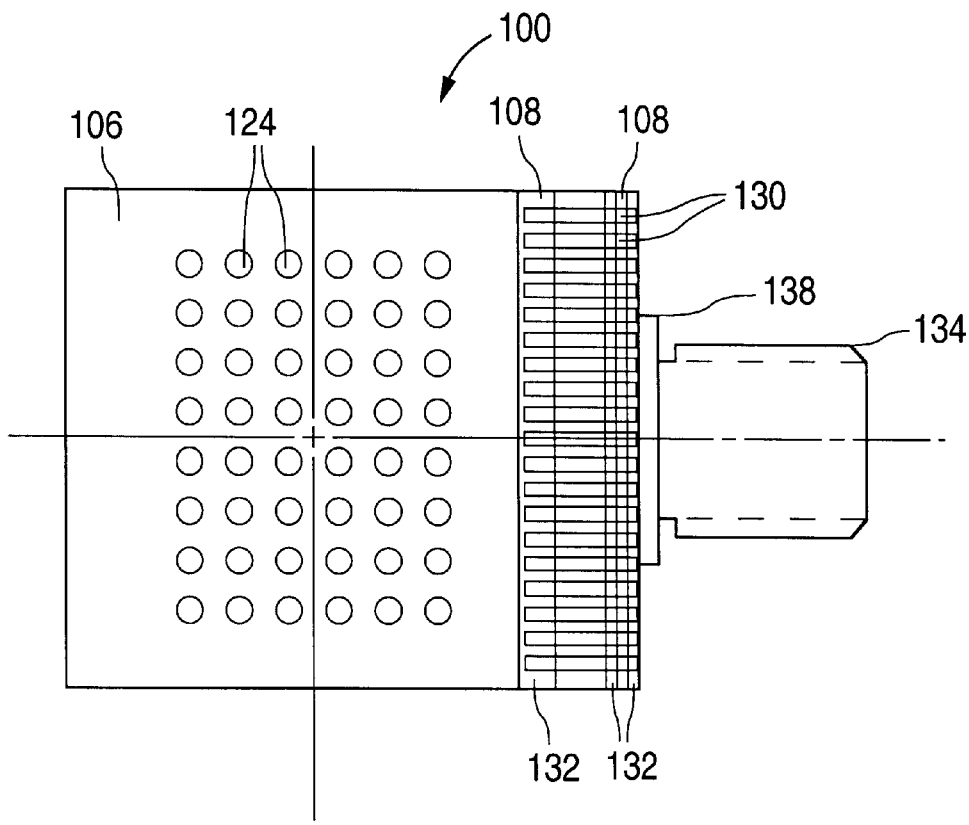
FIG. 3 is a bottom plan view of the first package embodiment illustrated in FIGS. 1 and 2.
Figure 4:
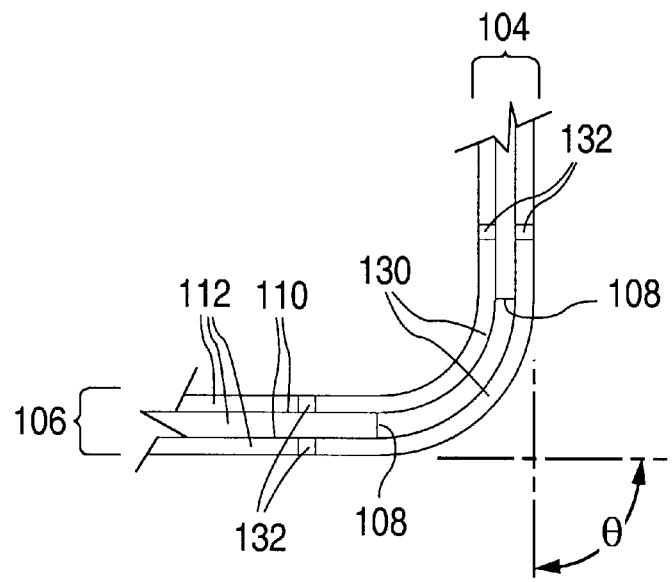
FIG. 4 is an enlarged view of the encircled portion IV—IV of the first package embodiment illustrated in FIG. 1.
Figure 5:
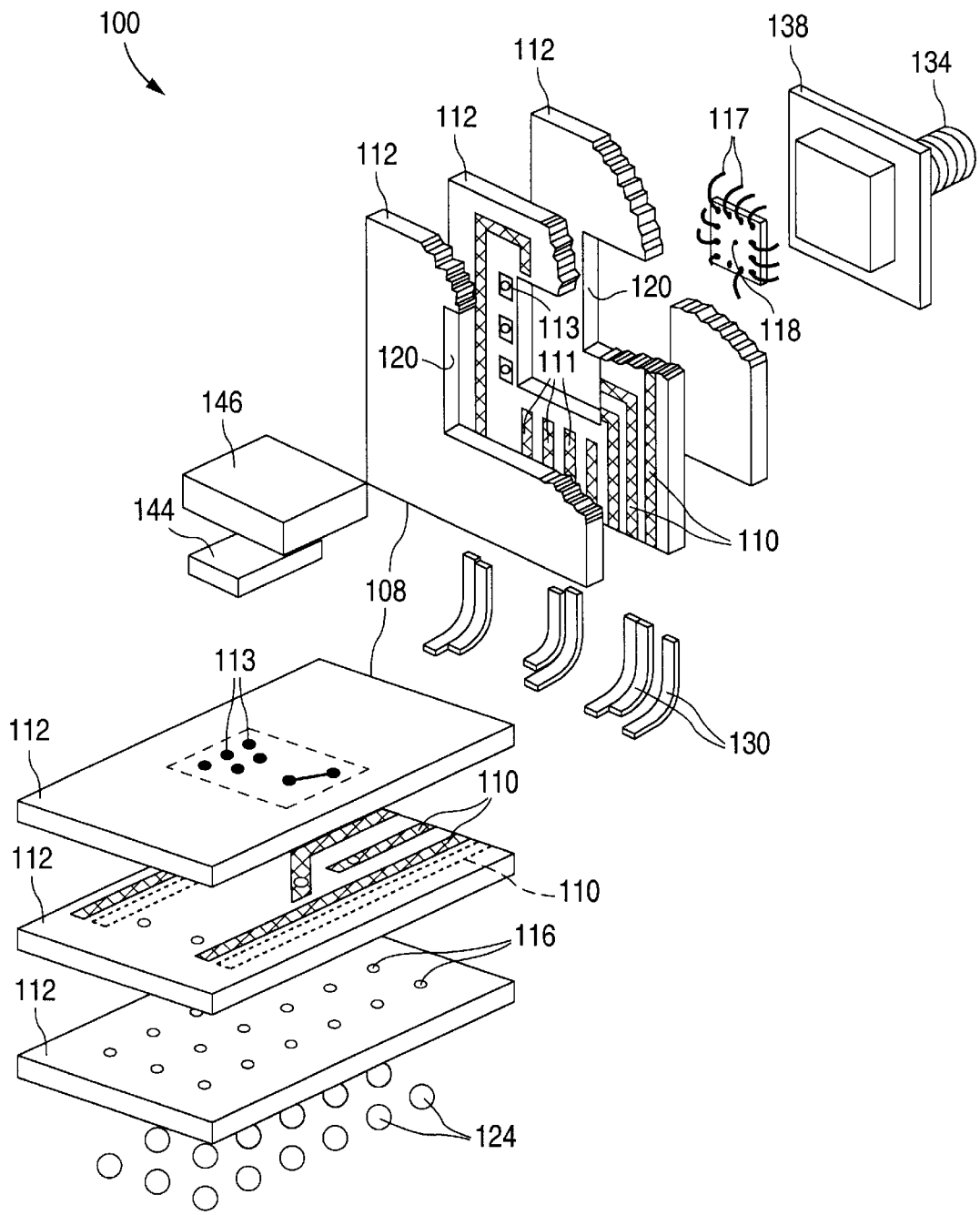
FIG. 5 is an exploded perspective view of the first package embodiment illustrated in FIGS. 1–4.

A first exemplary embodiment of an angulated semiconductor package 100 in accordance with the present invention is illustrated in the side elevation views of FIGS. 1 and 2, in the bottom plan view of FIG. 3, and in the exploded perspective view of FIG. 5. The package 100 comprises a rigid, dielectric substrate 102 having first and second portions 104 and 106 joined to one another at respective adjacent margins 108 thereof to form an angle Θ between the two portions. Each of the portions 104 and 106 has a plurality of electrically conductive paths 110 that are connected through the angle Θ to the electrically conductive paths in the other portion.

In the particular exemplary embodiments illustrated herein, the substrate portions 104 and 106 are orthogonal to one another, i.e., the angle Θ is a right angle. However, other relative angular dispositions of the two portions 104 and 106 are possible, ranging from acute to obtuse, depending on the particular diecoupling-and-connection problem at hand. For example, the angle Θ may be 30, 60, 90, 120, or 150 degrees, depending on the application.

Each of the portions 104 and 106 of the substrate 102 are similar in construction to a conventional PCB or ceramic laminate, i.e., they comprise one or more layers of a rigid dielectric 112, such as a ceramic or a composite of fiberglass and epoxy resin, with one or more interleaved layers of an electrically conductive metal 114, such as copper, aluminum, or tungsten, that have been patterned using known techniques, such as silk-screening or photo-etching, to define the conductive paths 110 therein.

Conductive pads 113 and lands 115 are formed on opposite surfaces of the two portions 104 and 106 to mount, e.g., electronic components 144 and electrical connectors 124, respectively. Conventional "vias" 116, i.e., plated-through holes, are formed at selected locations in the substrate portions 104 and 106 to interconnect the conductive paths 110, the pads 113, and the lands 115 to one another through the respective dielectric layers 112 of the two portions. In the particular embodiment illustrated in FIGS. 1–5, the two substrate portions 104 and 106 each comprises a middle dielectric layer 112 having a pattern of conductive paths 110 formed on respective opposite sides thereof, sandwiched between top and bottom dielectric layers 112.

A semiconductor device 118, e.g., a die, or a "micro-machine," such as a "micro-mirror light valve" of the type described in U.S. Pat. No. 5,864,132 to M. Little, is mounted to the first portion 104 of the substrate 102, and is connected to the electrically conductive paths 110 therein in one of several possible configurations. In the particular embodiment illustrated in FIGS. 1–5, the die 118 is mounted in a cavity 120 in the first portion 104. The cavity 120 is formed in the first, or top, dielectric layer 112 of the first portion 104 so that a surface of the second, or middle dielectric layer and end portions 111 of the conductive paths 110 disposed thereon are exposed through the cavity around the periphery thereof.

The device 118 is centrally mounted in the cavity 120 on, e.g., the surface of the central layer of dielectric 118 with, e.g., a thermally conductive adhesive, and is wire bonded to the exposed end portions 111 of the conductive paths 110, and/or bonding pads 113 located around the periphery of the cavity with conventional wire or ribbon bonds 117. A conventional cover, or lid 122 (omitted in FIG. 5), may be mounted on the surface of the first portion 104 to cover the device 118 and cavity 120 to hermetically seal the device and interior of the cavity from the environment. The sealed cavity 120 can be evacuated, and optionally, back-filled with a gas, e.g., dry nitrogen.

The second portion 106 of the substrate 102 includes connectors 124 for connecting electrical signals between the package 100 and, e.g., a PCB 126 (represented by a horizontal phantom line in FIG. 1) to which the package 100 is mounted. In the particular embodiment illustrated in FIGS. 1–5, these connectors 124 comprise an array of electrically conductive balls, e.g., solder balls, that are mounted on the bottom surface of the second portion 106 and electrically connected to the conductive paths 110 therein by the vias 116, and are of a known type used to surface-mount and electrically connect a conventional ball grid array ("BGA") semiconductor package to a PCB. However, in other possible embodiments, the connectors 124 can comprise, e.g., an array of electrically conductive lands or pins of the type used to mount and connect conventional land grid array ("LGA") or pin grid array ("PGA") semiconductor packages, respectively.

In the first angulated package embodiment 100, the two portions 104 and 106 of the substrate 102 are affixed to one another, and their respective conductive paths 110 are electrically connected to one another through the angle Θ, by two sets of resilient, arcuate leads 130. To effect this electromechanical connection, a pair of steps, or ledges 132, are cut into opposite sides of each of the respective adjacent margins 108 of the two portions 104 and 106 so as to expose end portions of the respective conductive paths 110 formed on the opposite sides of the middle dielectric layer 112, as illustrated in the enlarged detail of FIG. 4.

The opposite ends of the leads 130, which may be made from copper, an alloy of copper, or Alloy 42, are then respectively soldered or brazed to corresponding ones of the exposed end portions of the conductive paths 110 such that the leads form a resilient, angulated electromechanical bridge between the two portions 104 and 106. The resiliency of the bridge is advantageous in that it affords an angular "compliance" between the two portions 104 and 106 that is useful to accommodate angular tolerances between two mounting surfaces 140, 126 to which the two portions are respectively mounted.

In a high-power application, the dielectric material of the first portion 104 of the substrate 200 can comprise a ceramic, e.g., silicon dioxide, silicon nitride, mullite, quartz, alumina, or aluminum nitride. As illustrated in FIG. 1, a heat coupler 134 comprising, e.g., a threaded copper stud 136 brazed to a copper-tungsten alloy "heat slug," or flange 138, can be mounted on the first portion 104 by, e.g., brazing the flange of the heat spreader to it. The mounting cavity 120 can extend completely through the first portion 104 such that the backside of the flange 138 is exposed therein. The device 118 can be attached directly to the back side of the flange 138 by, e.g., a thermally conductive adhesive, or solder, and the threaded stud 136 can be connected to a heat sink 140 (represented by a vertical phantom line in FIG. 1), such as a cold plate that is convectively cooled with a liquid, e.g., Coolanol, ethylene glycol or water, or a gas, e.g., air or $CO_2$, so that the device is thermally coupled almost directly to the cooling medium, with a minimum of intervening thermal resistances therebetween.

In another, optical application, the lid 122 mounted over the device 118 can comprise a lens or a clear window, and can include a connector 142 (shown by a dotted outline in FIG. 1) for connecting a fiber optic cable (not illustrated) to the first portion 104 of the substrate 102 such that the end of the cable is optically coupled directly through the lens or window to the active surface of the device. This coupling permits the cable to depart from the package 100 in a direction perpendicular to the first portion 104 and parallel to a PCB 126 to which the package is mounted, rather than perpendicular to it, without the need for lossy prisms or the like, and is therefore advantageous in applications requiring direct optical coupling to a device in a low-profile package.

In another electro-optical embodiment, it is possible to combine the above device-coupling features to advantage. Thus, some light amplification or detection dies 118 are adversely affected by thermal background radiation, or "noise." In such an application, the die 118 can be coupled through the flange 138 to the first stage of, e.g., a small, thermoelectric cooler, or heat pump (not illustrated), rather than to the heat sink 140. The thermoelectric cooler can refrigerate the die 118 to sub-zero temperatures, which substantially reduces the thermal noise in and around the die and can thereby result in a significant improvement in the signal-to-noise ratio of the device.

In another possible embodiment, additional active or passive electronic components, e.g., a second die 144 (shown by dotted outline in FIG. 1), or resistors, capacitors or inductors, can be mounted to the top surface of the second portion 106 of the substrate 102 and electrically connected to the conductive paths 110 therein in a manner similar to that employed in the fabrication of a conventional semiconductor package, e.g., by wire bonding or a "flip chip" attachment thereof, or by other conventional surface-mount techniques.

The additional component(s) 144 can be sealed from the environment with a second lid, or a conventional plastic "mold cap" 146. This feature enables the package 100 to achieve an enhanced component packaging density, and has application to, e.g., a package for a micro-computer in which the microprocessor die 118 resides in the first portion 104 of the substrate 102 for close coupling to a fanned heat sink 140, while associated electronics 144, e.g., memory dies or certain passive components, are mounted and electrically interconnected therewith in the second portion 106, as described above.

A second exemplary embodiment of an angulated semiconductor package 200 in accordance with the present invention is illustrated in the side elevation views of FIGS. 6 and 7, and in the bottom plan view of FIG. 8. The second embodiment of the package 200 includes many features similar to those of the first embodiment 100. Features that are similar are referenced in the drawings with numbers corresponding to the reference numbers of the features of the first embodiment, plus 100.

As in the first embodiment, the second embodiment of angulated package 200 includes a substrate 202 having first and second portions 204 and 206 affixed to one another at an angle $\Theta=90°$. Each of the two portions 204 and 206 comprises a layer of a conductive metal 214 sandwiched between two layers of a dielectric material 212. The metal layer 214 has been patterned to define a plurality of conductive paths 210 that are connected through the angle $\Theta$ to the conductive paths in the other portion. Vias 216 are formed at selected locations in the substrate portions 204 and 206 to interconnect the conductive paths 210, pads 213, and lands 215 of the respective portions to one another through the respective thicknesses of the portions.

A semiconductor device 218 is mounted to the back side of the flange 238 of a heat coupler 234 and inside of a cavity 220 formed into the first portion 204 so as to expose end portions 211 of the conductive paths 210 around the periphery of the cavity. The device 218 is electrically connected to the end portions with wire or ribbon bonds 217 (FIG. 6). The cavity 220 is hermetically sealed with a lid 222 (omitted in FIG. 6 for clarity, shown spaced apart from the cavity 220 in FIG. 7).

As in the first embodiment, the second portion 206 includes an array of solder balls 224 for effecting mounting and electrical connection of the package 200 to a PCB (not illustrated), and for conveying electrical signals between the package and the PCB. Optionally, one or more additional active or passive components 244 (shown by dotted outline in FIGS. 6 and 7) can be mounted on the top surface of the second portion 206 and interconnected to the conductive paths 210 and/or solder ball connectors 224 with conductive vias 216.

A distinguishing feature of the second embodiment of angulated package 200 is that the two portions 204 and 206 of the substrate 202 are integral with one another such that the substrate consists of a single piece into which the angle $\Theta$ between the two portions has been formed. While the angle $\Theta$ can be formed into the substrate 202 in a number of ways, one advantageous method in the context of a ceramic substrate comprises "thermoforming" the angle into the substrate concurrently with the firing of the ceramic, in the following manner.

As is known in the art, a ceramic substrate is fashioned by casting a "slurry," i.e., an aqueous mixture of ceramic particles, e.g., particles of silicon dioxide, and binders, e.g., clay, into the form of a "green" (i.e., unfired) sheet or "tape" from which the liquid has been evaporated. The tape is then "fired," i.e., baked, at a high temperature ($\approx 3000°$ C.) to coalesce the particles and binders into a dense, hard matrix having certain desirable thermal, electrical and/or mechanical properties.

While the tape is in the green state, it is relatively soft and can be easily rolled or pressed, e.g., to laminate it to other layers or adjust its thickness, and is easily cut or machined, e.g., to form such features as the die cavity 120, 220 and the vias 116 described above. A mixture of tungsten particles and a liquid resin binder can be silk-screened onto the green tape and dried thereon to define "green" conductive paths 110, 210, which are typically "co-fired" along with the green tape to coalesce the tungsten particles into homogenous "metallizations," or conductive traces, of the metal, that are intimately bonded to the co-fired ceramic.

During the firing of the ceramic, the tape becomes very soft and malleable. This characteristic provides an advantageous technique for forming the angle $\Theta$ into the one-piece substrate 202, namely, by thermoforming. In particular, as illustrated in FIG. 9, the green substrate 202 can be positioned over a "boat," i.e., a forming tool 250 made of a refractory material, e.g., carbon, situated in the kiln in which the substrate is to be fired. The forming tool 250 has a triangular profile, with an apex 252 that duplicates the final angular bend $\Theta$ that it is desired to reproduce in the substrate 202. As the temperature of the substrate 202 increases, the tape, which is initially planar in form (shown by dashed lines in FIG. 9), becomes soft, and sags under the influence of gravity to conform to the upper surface of the forming tool 250, as shown in FIG. 9. To facilitate a reduced bend $\Theta$ radius, a weight (not illustrated) having a lower surface conforming to the upper surface of the forming tool 250 may be disposed on top of the substrate 202 such that the substrate is compressed between the weight and the forming tool when the substrate becomes soft at high temperatures. When the substrate 202 is thereafter cooled, it retains the shape of the upper surface of the tool 250, including the angular bend Θ between the two substrate portions 204 and 206, as shown in FIG. 7.

It may be noted in FIG. 9 that the apex 252 of the forming tool 250 includes two angular bends, each equal to about Θ/2, such that their sum is equal to Θ. This gradual angular transition is more desirable than forming a single sharp angle, e.g., a right angle, into a one-piece ceramic substrate 202, because such a transition can act as a stress-concentrator, which can cause the substrate to fracture easily under small mechanical loads. Another advantageous form of a more gradual bend that can be thermoformed between the two portions 204 and 206 of a one-piece substrate 202 is a smooth, full-radius bend (not illustrated).

A third exemplary embodiment of an angulated semiconductor package 300 in accordance with the present invention is illustrated in the side elevation views of FIGS. 10 and 11, and in the bottom plan view of FIG. 12. The third embodiment of the package 300 also includes many features that are similar to those of the first embodiment of angulated package 100, and accordingly, such features are referenced in the drawings with numbers corresponding to those of the features of the first embodiment, plus 200.

The third embodiment of angulated package 300 differs principally from the first and second embodiments 100 and 200 in the manner in which the first and second portions 304 and 306 of the substrate 302 are joined to one another to electrically interconnect the portions and form the angle Θ between them. In a ceramic third embodiment, this is advantageously effected by forming complementary castellations 360 on the respective adjacent margins 308 of the two substrate portions 304 and 306 while the two portions are in the green state. Additionally, the electrically conductive paths 310 in each of the two portions 304 and 306 are laid out to extend along the edges of the respective castellations 360 therein, as shown in FIG. 10, in which the top dielectric layer 312 is shown as if transparent to reveal the configuration of the underlying conductive paths 310.

As illustrated in FIG. 13, the two green portions 304 and 306 of the substrate 302 are then positioned on a holding fixture 350 disposed in the firing kiln, with the respective castellations 360 of the portions interdigitated with one another, and with the respective conductive paths 310 extending along the edges of the respective castellations in crossing abutment with each other. The triangular holding fixture 350 is made of a refractory material, e.g., carbon, and includes an apex 352 that duplicates the final angle Θ, e.g., the right angle shown, that it is desired to produce between the two portions 304 and 306 of the substrate 302.

As the temperature in the kiln is raised, the respective castellations 360 and the metal in the respective conductive paths 110 of the two substrate portions 304 and 306 soften and respectively fuse, or weld, to one another, thereby simultaneously co-firing the green ceramic and conductive paths of the two portions, and respectively welding the castellations and conductive paths of each portion to each other such that the two portions are joined to each other in the desired angular relationship Θ, and the respective conductive paths in the two portions are electrically connected to one another through the angular bend.

It may be noted in the third embodiment of the package 300 that, unlike the second embodiment 200 described above, the angular transition Θ between the two substrate portions 304 and 306 is made in a single, sharp bend. However, because the two portions 304 and 306 are not integral with one another, i.e., the substrate 302 does not consist of a single piece, this sharp transition does not act as a stress concentrator in the substrate. Accordingly, the third embodiment of angulated package 300 can provide an advantageous alternative in situations in which a sharp angular transition between the two portions 304 and 306 is indicated.

By now, those of skill in the art will appreciate that many variations, modifications, and substitutions can be made in the techniques and materials of the present invention without departing substantially from its spirit and scope. Accordingly, the scope of the present invention should not be limited to that of the particular embodiments described and illustrated herein, as these are merely exemplary in nature. Rather, the scope of the present invention should be commensurate with that of the claims appended hereafter and their equivalents.

What is claimed is:

1. A semiconductor package, comprising:
    a dielectric substrate having two portions joined to one another at respective adjacent margins thereof to form an angle other than a 180° angle therebetween, each portion having electrically conductive paths connected to one another through the angle;
    a semiconductor device mounted to a first one of the semiconductor portions and in electrical connection with the electrically conductive paths thereof; and,
    a lid mounted to the first portion and covering the device, wherein the lid comprises a window through which at least an optical portion of the device is visible.

2. The semiconductor package of claim 1, wherein the two portions are joined to one another at a right angle.

3. The semiconductor package of claim 1, further comprising electrical connectors on a second one of the two portions and in electrical connection with the conductive paths thereof for electrically connecting the package to a printed circuit board ("PCB").

4. The semiconductor package of claim 1, wherein the lid comprises a connector for a fiber optic cable.

5. The semiconductor package of claim 1, wherein the device is mounted in a cavity in the fist portion.

6. The semiconductor package of claim 1, wherein the two dielectric substrate portions are integrally connected.

7. The semiconductor package of claim 1, further comprising an electronic device mounted on a second one of the dielectric substrate portions and electrically coupled to the electrically conductive paths thereof.

8. The electronic package of claim 1, wherein the first and second portions of the dielectric substrate are joined to each other by interdigitated portions on the respective adjacent margins thereof.

9. The semiconductor package of claim 1, further comprising electrical connectors on a second one of the two portions and in electrical connection with the conductive paths thereof for electrically connecting the package to a PCB, wherein the electrical connectors comprise an array of conductive balls, lands, or pins.

10. The electronic package of claim 9, wherein the first and second portions of the dielectric substrate are joined to each other by interdigitated portions on the respective adjacent margins of the dielectric substrate.

11. A semiconductor package, comprising:
    a dielectric substrate having two portions joined to one another at respective adjacent margins thereof to form an angle other than a 180° angle therebetween, each portion having electrically conductive paths connected to one another through the angle, wherein the two portions are joined to one another by interdigitated portions at the respective adjacent margins thereof; and, a semiconductor device mounted to a first one of the portions and in electrical connection with the electrically conductive paths thereof.

12. The semiconductor package of claim 11, further comprising one or more electronic components mounted to a second one of the portions and in electrical connection with the conductive paths thereof.

13. The semiconductor package of claim 11, wherein the electrically conductive paths in each of the portions extend along edges of the interdigitated portions at the respective adjacent margins thereof and are electrically connected thereat to the conductive paths in the other portion.

14. The semiconductor package of claim 11, further comprising an electronic device mounted on a second one of the dielectric substrate portions and electrically coupled to the electrically conductive paths thereof.

15. The semiconductor package of claim 11, further comprising electrical connectors on a second one of the two portions and in electrical connection with the conductive paths thereof for electrically connecting the package to a PCB, wherein the electrical connectors comprise an array of conductive balls, lands, or pins.

16. The semiconductor package of claim 11, wherein the semiconductor device comprises an optical circuit or a micromachine.

17. A semiconductor package comprising:

a substrate having a first portion and a second portion joined at an oblique or right angle to the first portion;

a first semiconductor device mounted on and electrically connected to the first portion;

input/output terminals on tie second portion, wherein the first semiconductor device is electrically connected through the oblique or right angle to the input/output terminals; and, a second semiconductor die mounted on the second portion of the substrate.

18. The semiconductor package of claim 17, further comprising a lid mounted to the first portion and covering the first semiconductor device.

19. The semiconductor package of claim 18, wherein the lid comprises a window through which at least an optical portion of the first semiconductor device is visible.

20. The semiconductor package of claim 17, wherein the first semiconductor device is an optical device.

21. The semiconductor package of claim 17, wherein the first and second portions are integrally joined through the oblique or right angle.

22. The semiconductor package of claim 17, wherein the first semiconductor device includes an optical circuit or a micromachine.

23. The electronic package of claim 17, wherein the first and second portions of the dielectric substrate are joined to each other by interdigitated portions on the respective adjacent margins of the dielectric substrate.

* * * * *